(12) United States Patent
Minoura

(10) Patent No.: US 11,688,609 B2
(45) Date of Patent: Jun. 27, 2023

(54) ETCHING METHOD AND PLASMA PROCESSING APPARATUS

(71) Applicant: Tokyo Electron Limited, Tokyo (JP)

(72) Inventor: Yuya Minoura, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/326,598

(22) Filed: May 21, 2021

(65) Prior Publication Data

US 2021/0375635 A1  Dec. 2, 2021

(30) Foreign Application Priority Data

May 29, 2020 (JP) .................. 2020-094873
Sep. 14, 2020 (JP) .................. 2020-154148

(51) Int. Cl.
*H01L 21/311* (2006.01)
*H01L 21/02* (2006.01)
*H01J 37/32* (2006.01)

(52) U.S. Cl.
CPC .. *H01L 21/31116* (2013.01); *H01J 37/32449* (2013.01); *H01J 37/32724* (2013.01); *H01L 21/0212* (2013.01); *H01L 21/02164* (2013.01); *H01L 21/31144* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 8,187,980 B2* | 5/2012 | Ogasawara | H01L 21/3065 438/719 |
| 2013/0059450 A1* | 3/2013 | Le Gouil | H01L 21/31116 438/715 |
| 2015/0179466 A1* | 6/2015 | Takayama | H01L 21/31144 438/694 |
| 2018/0204728 A1* | 7/2018 | Oomori | H01L 21/3065 |

FOREIGN PATENT DOCUMENTS

| | | |
|---|---|---|
| JP | 2003-282538 | 10/2003 |
| JP | 2006-156992 | 6/2006 |
| JP | 2016-122774 | 7/2016 |
| WO | 02/39494 | 5/2002 |

* cited by examiner

*Primary Examiner* — Stephanie P Duclair
(74) *Attorney, Agent, or Firm* — IPUSA, PLLC

(57) ABSTRACT

An etching method prepares a substrate having laminated films including a first film and a second film that are alternately laminated, and a mask on the laminated films, and etches the laminated films by plasma of a process gas including a carbon and fluorine-containing gas. The carbon and fluorine-containing gas includes an unsaturated bond of C, and a $CF_3$ group.

12 Claims, 14 Drawing Sheets

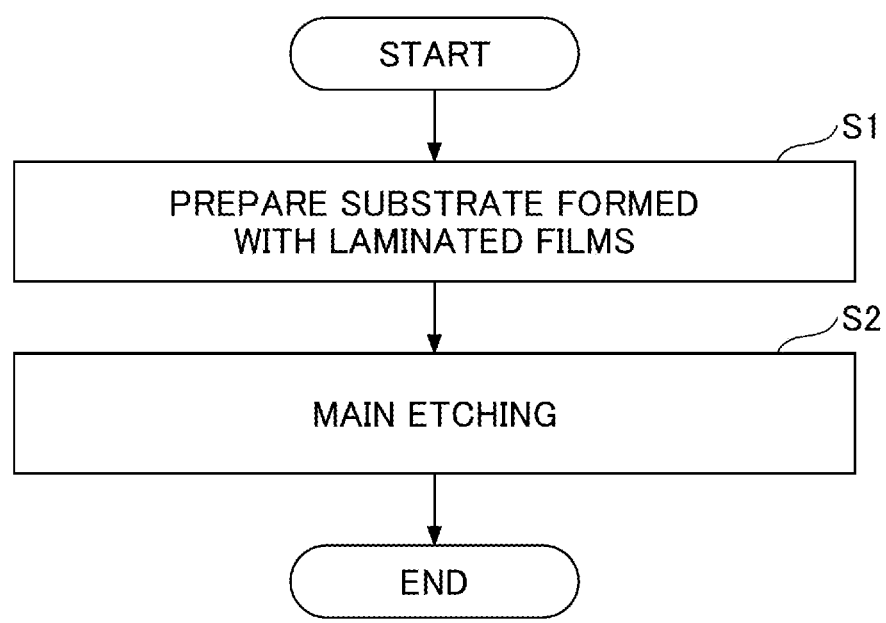

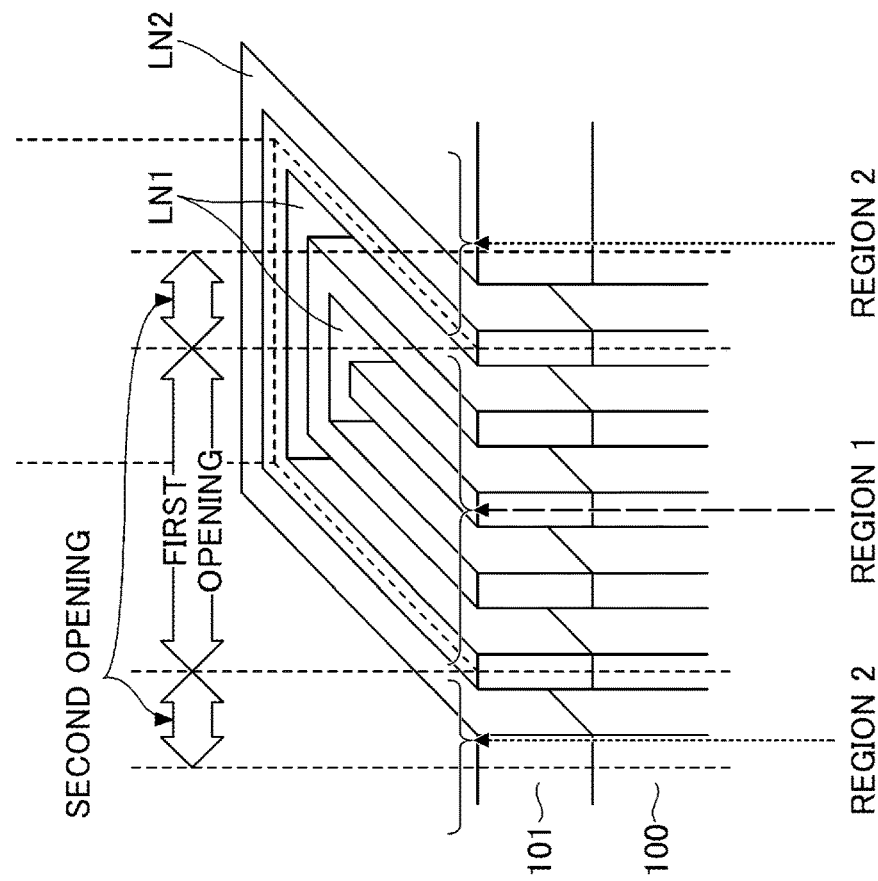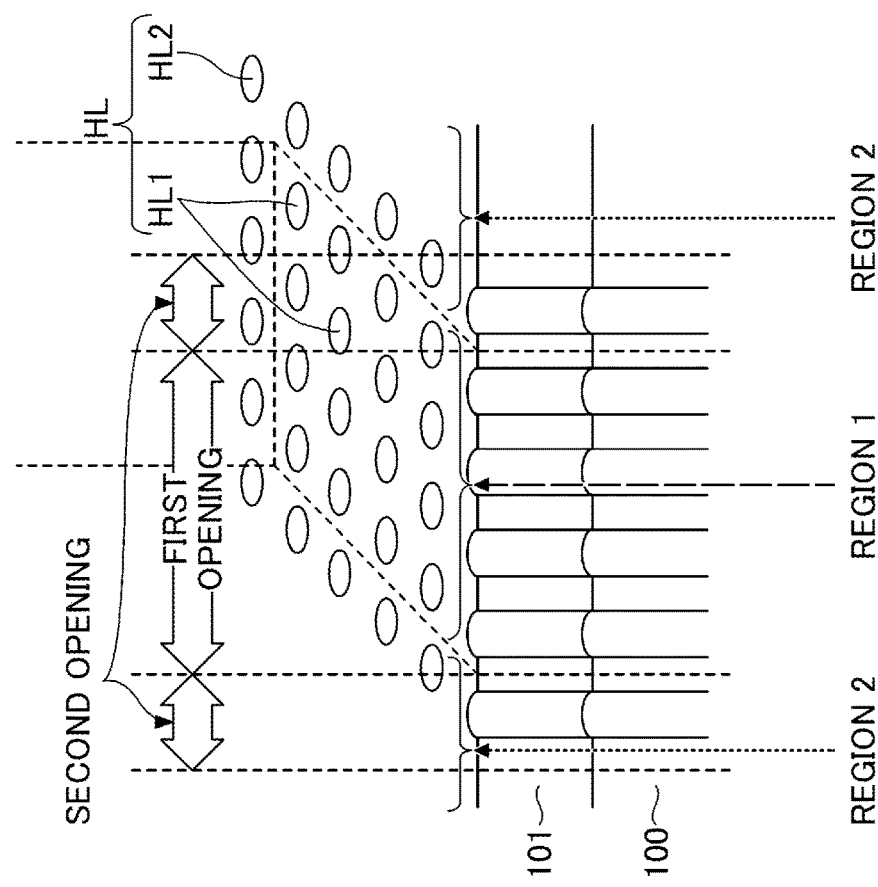

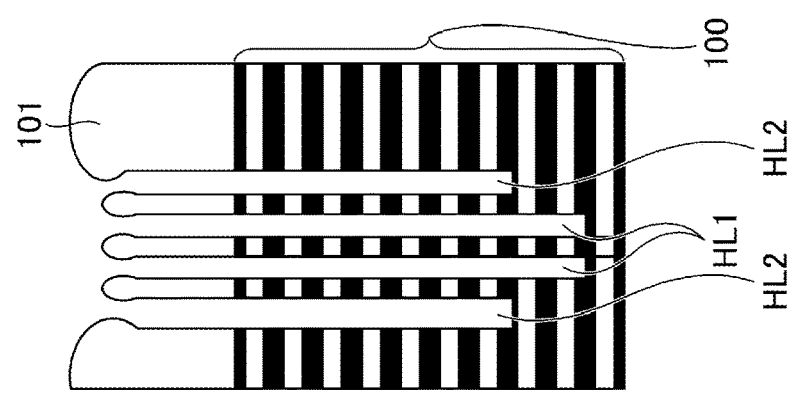
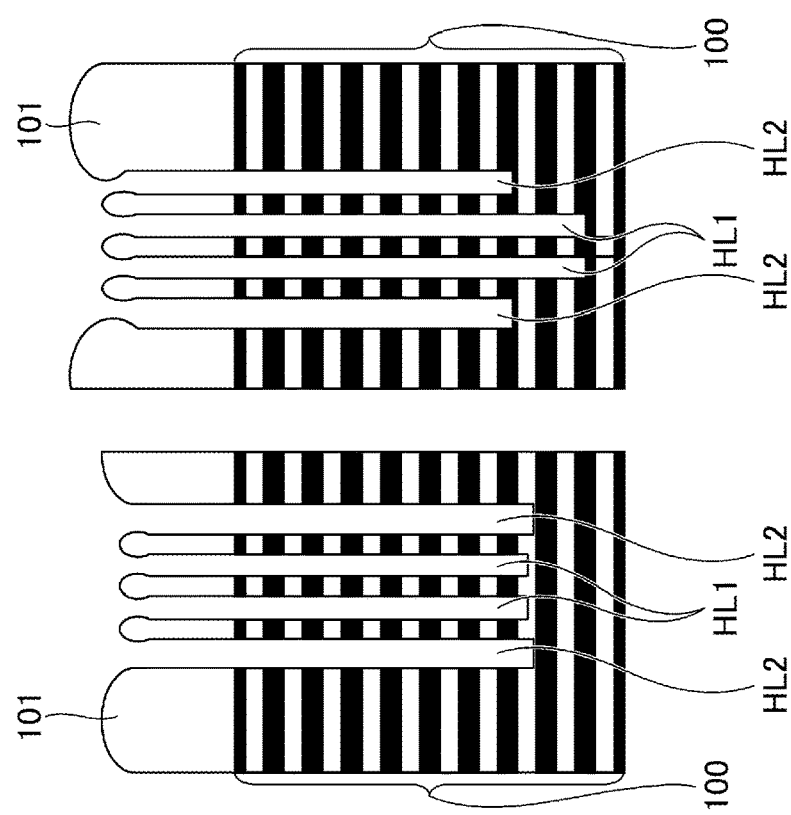
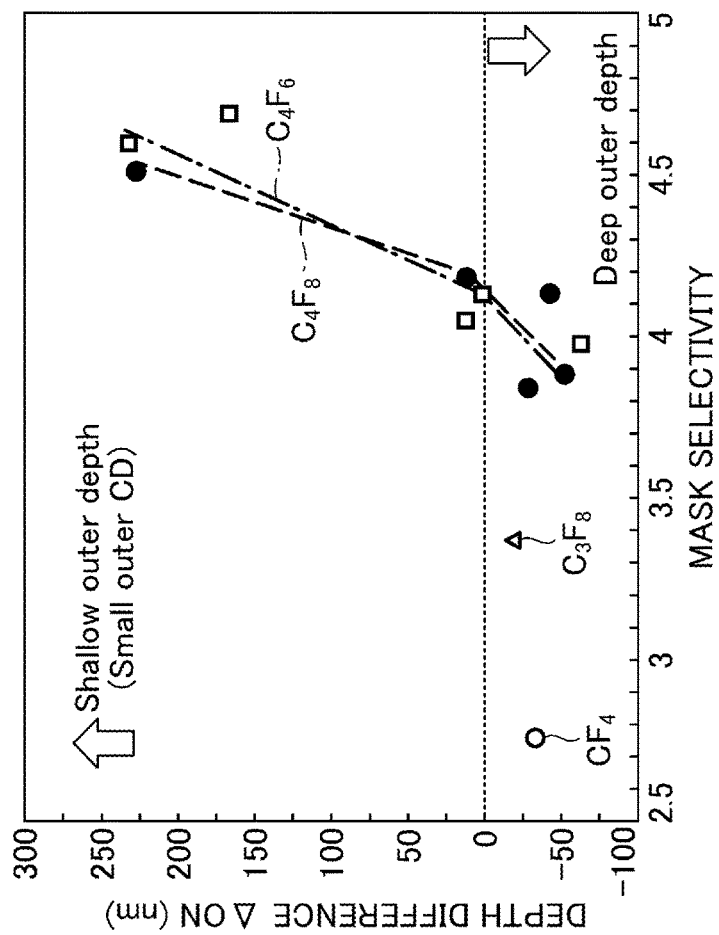

FIG.14

| GAS | MASK SELECTIVITY (OUTER OPENNESS MAINTAINED) | ON E/R (MASK SELECTIVITY FIXED TO 4) |
|---|---|---|
| $H_2/C_4F_8$ | 4.2 | 305 |
| $H_2/CH_2F_2$ | 4.5 | 315 |
| $H_2/C_3H_2F_4$ | 4.8 | 301 |
| $H_2/C_4F_6$ | 4.2 | 285 |
| $H_2/C_3F_8$ | 3.4 | — |

ETCHING METHOD AND PLASMA PROCESSING APPARATUS

CROSS-REFERENCE TO RELATED APPLICATIONS

This application is based upon and claims priority to Japanese Patent Application No. 2020-094873, filed on May 29, 2020, and Japanese Patent Application No. 2020-154148, filed on Sep. 14, 2020, the entire contents of which are incorporated herein by reference.

BACKGROUND

1. Field of the Invention

The present disclosure relates to etching methods, and plasma processing apparatuses.

2. Description of the Related Art

For example, Japanese Laid-Open Patent Publication No. 2016-122774 proposes an etching technique for forming openings, such as holes, grooves, or the like, having a high aspect ratio.

SUMMARY

According to one aspect of the present disclosure, an etching method includes preparing a substrate having laminated films including a first film and a second film that are alternately laminated, and a mask on the laminated films; and etching the laminated films by plasma of a process gas including a carbon and fluorine-containing gas, wherein the carbon and fluorine-containing gas includes an unsaturated bond of C, and a $CF_3$ group.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF THE DRAWINGS

FIG. 2 is a diagram illustrating an example of an etching method according to one embodiment.

FIG. 4A and FIG. 4B are diagrams illustrating an example of an opening according to one embodiment.

FIG. 5A, FIG. 5B, and FIG. 5C are diagrams illustrating an example of a problem of etching.

FIG. 14 is a table illustrating the mask selectivity and the etch rate of the laminated films for each gas specifies according to one embodiment.

DETAILED DESCRIPTION

Figure 1:
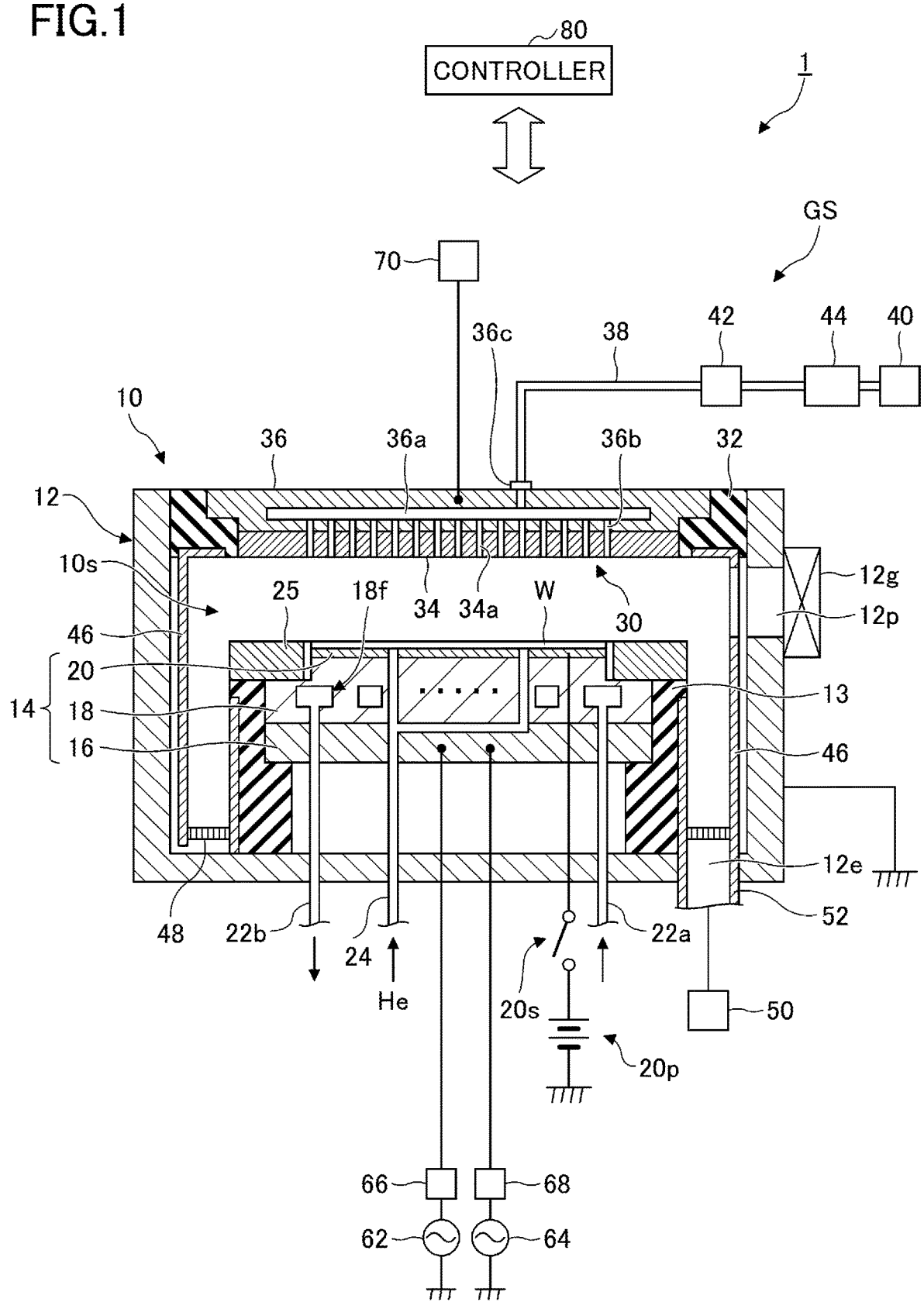
FIG. 1 is a cross sectional diagram schematically illustrating an example of a plasma processing apparatus according to one embodiment.

In an etching process, a mask having a plurality of patterned holes (or lines) may be used to etch a film which is to be etched. In this case, the patterned holes (or lines) are densely formed in a predetermined region, but after the etching ends, differences are generated in the etching depth between a center portion and a peripheral portion of the predetermined region (inner-outer loading phenomenon). This phenomenon introduces a notable problem when a mask selectivity is high, that is, under a condition in which deposit formation is highly probable, and may cause circuit failures. For this reason, there are demands for an etching method which enables dimensions of the mask openings to be the same at the center portion and the peripheral portion of the pattern. The mask selectivity is a ratio of an etch rate (or etching rate) of the film which is to be etched with respect to an etch rate of the mask (mask E/R) during the etching process.

Accordingly, it is desirable to provide a technique which can reduce differences in the shapes of openings formed in an etched film, while improving a mask selectivity.

An etching method according to one embodiment generates plasma from a gas including a hydrogen-containing gas, and a carbon and fluorine-containing gas, and etches laminated films (ON layer) of silicon oxide (SiOx) films and silicon nitride (SiN) films by the generated plasma, wherein the carbon and fluorine-containing gas includes a multivalent hydrofluorocarbon gas including a double bond of C and a $CF_3$ group.

Differences occur in amounts of active species and generated reaction products supplied to each of dense and coarse regions of the mask pattern, and thus, Critical Dimension (CD) values of the openings become different between the center portion and the peripheral portion of the pattern region. This difference in the CD values introduce differences in the shapes of the etched film after the etching. For this reason, a carbon gas, which causes deposits (reaction products) to be uniformly and perpendicularly deposited on the mask as much as possible, is used. Radicals generated from a hydrofluorocarbon gas have a sticking coefficient higher than that of radicals generated from a fluorocarbon gas, and larger for polymer molecules. The double bond of C contributes to the deposits on the mask, and the $CF_3$ group contributes to securing the etch rate of the ON layer (ON E/R), thereby enabling a high mask selectivity to be obtained.

The etching method according to one embodiment can reduce the differences generated in the shapes of each of the openings formed in the etched film.

Hereinafter, embodiments of the present disclosure will be described with reference to the drawings. In the drawings, the same constituent elements or parts are designated by the same reference numerals, and a repeated description of the same constituent elements or parts may be omitted.

[Plasma Processing Apparatus]

First, an example of a plasma processing apparatus 1 used in the etching method according to one embodiment will be described, with reference to FIG. 1. FIG. 1 is a cross sectional diagram schematically illustrating the example of the plasma processing apparatus 1 according to one embodiment. The plasma processing apparatus 1 in this example illustrated in FIG. 1 is a capacitively coupled apparatus.

The plasma processing apparatus 1 includes a chamber 10. The chamber 10 provides an internal space 10s therein. The chamber 10 includes a chamber body 12. The chamber body 12 has a generally cylindrical shape. The internal space 10s is provided inside the chamber body 12. The chamber body 12 is formed of aluminum, for example. A film (or corrosion resistant film) having corrosion resistance is provided on an inner wall surface of the chamber body 12. The corrosion resistant film may be an oxide film formed of ceramics, such as alumina (aluminum oxide), yttrium oxide, or the like, and subjected to an anode oxidation process.

A passage 12p is formed in a sidewall of the chamber body 12. A substrate W passes through the passage 12p when transported between the internal space 10s and an exterior of the chamber 10. The passage 12p may be opened and closed by a gate valve 12g. The gate valve 12g is provided along the sidewall of the chamber body 12.

A support 13 is provided on a bottom of the chamber body 12. The support 13 has a generally cylindrical shape, and is formed of an insulative material. The support 13 extends upward from the bottom of the chamber body 12 inside the internal space 10s. An edge ring 25 (also referred to as a "focus ring"), which surrounds a periphery of the substrate W, is provided on the support 13. The edge ring 25 has a generally cylindrical shape, and may be formed of silicon or the like.

The plasma processing apparatus 1 further includes a stage (or substrate support) 14. The stage 14 is supported by the support 13. The stage 14 is provided inside the internal space 10s. The stage 14 is configured to support the substrate W inside the chamber 10, that is, inside the internal space 10s.

The stage 14 includes a lower electrode 18, and an electrostatic chuck 20 according to one exemplary embodiment. The stage 14 may further include an electrode plate 16. The electrode plate 16 may be formed of a conductor, such as aluminum or the like, and has a generally disk shape. The lower electrode 18 is provided on the electrode plate 16. The lower electrode 18 is formed of a conductor, such as aluminum or the like, and has a generally disk shape. The lower electrode 18 is electrically connected to the electrode plate 16. An outer peripheral surface of the lower electrode 18 and an outer peripheral surface of the electrode plate 16 are surrounded by the support 13.

The electrostatic chuck 20 is provided on the lower electrode 18. Electrodes of the electrostatic chuck 20 are connected to a DC power supply 20p via a switch 20s. When a voltage from the DC power supply 20p is applied to the electrodes of the electrostatic chuck 20, the substrate W is held on the electrostatic chuck 20 by electrostatic attraction. The electrostatic chuck 20 supports the substrate W and the edge ring 25.

A flow passage 18f is provided inside the lower electrode 18. A heat exchange medium (for example, a coolant) is supplied from a chiller unit (not illustrated) that is provided outside the chamber 10, to the flow passage 18f, via a pipe 22a. The heat exchange medium supplied to the flow passage 18f is returned to the chiller unit via a pipe 22b. In the plasma processing apparatus 1, a temperature of the substrate W placed on the electrostatic chuck 20 is adjusted by the heat exchange between the heat exchange medium and the lower electrode 18.

The plasma processing apparatus 1 is provided with a heat transfer gas supply line 24. The heat transfer gas supply line 24 supplies a heat transfer gas (for example, He gas) from a heat transfer gas supply mechanism (not illustrated) to in between an upper surface of the electrostatic chuck 20 and a lower surface of the substrate W.

The plasma processing apparatus 1 further includes an upper electrode 30. The upper electrode 30 is disposed above the stage 14, at a position opposing the stage 14. The upper electrode 30 is supported on an upper portion of the chamber body 12, via a member 32. The member 32 is formed of an insulative material. The upper electrode 30 and the member 32 close an upper opening of the chamber body 12.

The upper electrode 30 may include a top plate 34 and a support member 36. A lower surface of the top plate 34 faces the internal space 10s. The top plate 34 may be formed of a low-resistance conductor or semiconductor having a low Joule heat. A plurality of gas discharge holes 34a are formed in the top plate 34. The plurality of gas discharge holes 34a penetrate the top plate 34 in a thickness direction thereof.

The support member 36 detachably supports the top plate 34. The support member 36 is formed of a conductive material, such as aluminum or the like. A gas diffusion chamber 36a is provided inside the support member 36. A plurality of gas holes 36b are formed in the support member 36. The plurality of gas holes 36b extend downward from the gas diffusion chamber 36a. The plurality of gas holes 36b communicate with the plurality of gas discharge holes 34a, respectively. A gas inlet 36c is formed in the support member 36. The gas inlet 36c connects to the gas diffusion chamber 36a. A gas supply line 38 is connected to the gas inlet 36c.

A gas supply GS, including a gas source group 40, a flow controller group 44, and a valve group 42, is connected to the gas supply line 38. The gas source group 40 is connected to the gas supply line 38 via the flow controller group 44 and the valve group 42. The gas source group 40 includes a plurality of gas sources. The valve group 42 includes a plurality of on-off valves. The flow controller group 44 includes a plurality of flow controllers. Each of the plurality of flow controllers of the flow controller group 44 may be a mass flow controller or a pressure controlled flow controller. Each of the plurality of gas sources of the gas source group 40 is connected to the gas supply line 38, via a corresponding flow controller of the flow controller group 44 and a corresponding on-off valve of the valve group 42. A power supply 70 is connected to the upper electrode 30. The power supply 70 applies, to the upper electrode 30, a voltage for attracting positive ions present inside the internal space 10s toward the top plate 34.

In the plasma processing apparatus 1, a shield 46 is detachably provided along the inner wall surface of the chamber body 12. The shield 46 is also provided on an outer periphery of the support 13. The shield 46 prevents reaction products, such as etching byproducts or the like, from depositing onto the chamber body 12. The shield 46 may be formed by forming a corrosion resistant film on a surface of a member formed of aluminum. The corrosion resistant film may be an oxide film made of an oxide, such as alumina, yttrium oxide, or the like.

A baffle plate 48 is provided between the support 13 and the sidewall of the chamber body 12. The baffle plate 48 may be formed by forming a corrosion resistant film on a surface of a member formed of aluminum. The corrosion resistant film may be an oxide film made of an oxide, such as alumina, yttrium oxide, or the like. A plurality of through holes are formed in the baffle plate 48. An exhaust port 12*e* is provided below the baffle plate 48, at the bottom of the chamber body 12. An exhaust device 50 is connected to the exhaust port 12*e*, via an exhaust pipe 52. The exhaust device 50 includes a pressure regulating valve, and a vacuum pump, such as a turbo-molecular pump or the like.

The plasma processing apparatus 1 includes a first high-frequency power supply 62 for applying high-frequency power HF for plasma excitation. The first high-frequency power supply 62 is configured to generate the high-frequency power HF to generate the plasma from the gas inside the chamber 10. A frequency of the high-frequency power HF may be in a range of 40 MHz to 100 MHz, for example. The high-frequency power HF may be supplied by a pulse voltage having a rectangular waveform.

The first high-frequency power supply 62 is electrically connected to the electrode plate 16 and the lower electrode 18, via a matching device 66. The matching device 66 includes a matching circuit. The matching circuit of the matching device 66 is configured to match an impedance on a load side (on the side of the lower electrode 18) of the first high-frequency power supply 62, to an output impedance of the first high-frequency power supply 62. In another embodiment, the first high-frequency power supply 62 may be electrically connected to the upper electrode 30, via the matching device 66.

The plasma processing apparatus 1 may further include a second high-frequency power supply 64 for applying high-frequency power LF for a bias voltage. The second high-frequency power supply 64 is configured to generate the high-frequency power LF. A frequency of the high-frequency power LF may be suited primarily for attracting ions onto the substrate W, and may be in a range of 400 kHz to 3 MHz, for example. The high-frequency power LF may be supplied by a pulse voltage having a rectangular waveform.

The second high-frequency power supply 64 is electrically connected to the electrode plate 16 and the lower electrode 18, via an matching device 68. The matching device 68 includes a matching circuit. The matching circuit of the matching device 68 is configured to match an impedance of a load side (on the side of lower electrode 18) of the second high-frequency power supply 64, to an output impedance of the second high-frequency power supply 64.

The plasma processing apparatus 1 may further include a controller 80. The controller 80 may be a computer including a processor, a storage device such as a memory or the like, an input device, a display device, a signal input-output interface, or the like. The controller 80 controls each part of the plasma processing apparatus 1. In the controller 80, the input device may be used by an operator to perform an input operation or the like, to input a command for managing the plasma processing apparatus 1. In the controller 80, the display device may visualize and display an operating status of the plasma processing apparatus 1. Further, the storage device of the controller 80 may store a control program and recipe data. The control program, when executed by the processor of the controller 80, causes the plasma processing apparatus 1 to perform various processes. The various processes, such as the plasma processing method, for example, are performed by the plasma processing apparatus 1 when the processor of the controller 80 executes the control program and controls each part of the plasma processing apparatus 1 according to the recipe data.

A surface temperature of the substrate (for example, a wafer temperature) may be adjusted by transferring a temperature of the electrostatic chuck 20, which is adjusted to a desired temperature by the heat exchange medium supplied from the chiller unit via the pipe 22*a*, to the substrate W via the surface of the electrostatic chuck 20 and the heat transfer gas. However, the substrate W is exposed to the plasma generated by the high-frequency power HF for the plasma excitation, and ions attracted by the high-frequency power LF for the bias voltage and light from the plasma impinge on the substrate W. For this reason, the temperature of the substrate W, particularly the surface temperature of the substrate W exposed to the plasma, becomes higher than the adjusted temperature of the electrostatic chuck 20. In addition, the surface temperature of the substrate W may be raised by radiant heat from the sidewall of the chamber 10 and the opposing electrodes that are temperature adjusted. Consequently, if the actual temperature of the substrate W during the etching process can be measured, or if a temperature difference between the adjusted temperature of the electrostatic chuck 20 and the actual surface temperature of the substrate W can be estimated from process conditions, the temperature to which the electrostatic chuck 20 is adjusted may be lowered in order to adjust the surface temperature of the substrate W to fall within a predetermined temperature range.

[Etching Method]

Figure 3A:
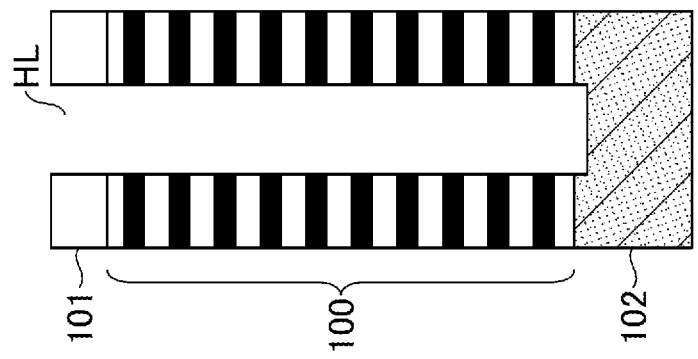
FIG. 3A, FIG. 3B, and FIG. 3C are diagrams illustrating laminated films which are films to be etched, and a mask structure according to one embodiment.
Figure 3B:
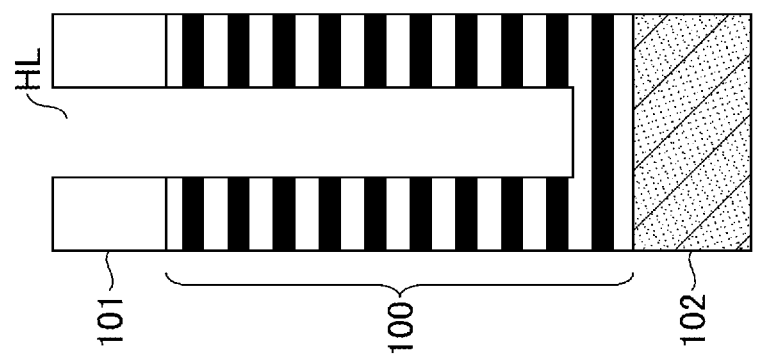
Figure 3C:
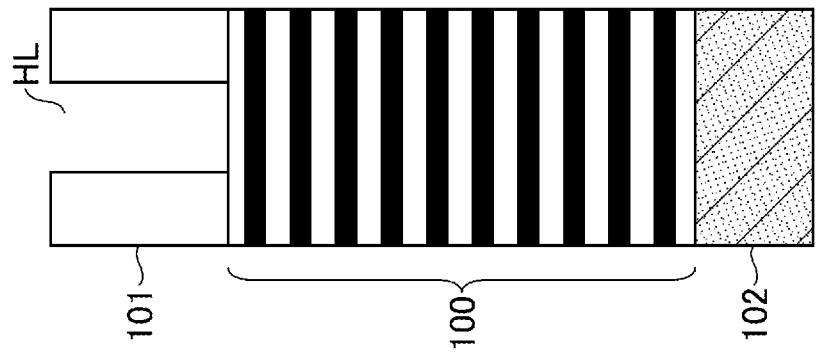

The etching method according to one embodiment will be described, with reference to FIG. 2 and FIG. 3A through FIG. 3C. FIG. 2 is a diagram illustrating an example of the etching method according to one embodiment. FIG. 3A through FIG. 3C are diagrams illustrating laminated films which are films to be etched, and a mask structure according to one embodiment.

As illustrated in FIG. 2, in the etching method according to one embodiment, the substrate W illustrated in FIG. 3A is prepared (step S1). The prepared substrate W includes laminated films 100, and a mask 101 provided on the laminated films 100. The laminated films 100 include silicon oxide films and silicon nitride films that are alternately laminated, as illustrated in FIG. 3A. The silicon oxide film is an example of a first film, and the silicon nitride film is an example of a second film.

Next, the laminated films 100 are etched by the plasma generated by the plasma processing apparatus 1 (step S2). The etching performed in step S2 may also be referred to as a main etching.

FIG. 3A illustrates a film structure of the laminated films 100, which are films to be etched, and the mask 101, in an initial state before the etching is performed. The substrate W includes the laminated films 100, the mask 101 provided on the laminated films 100, and an underlayer 102 disposed under the laminated films 100. The mask 101 is formed of an organic material, and an opening HL is formed in the mask 101. The underlayer 102 is formed of polysilicon, for example. However, the underlayer 102 is not limited to polysilicon, and may be formed of amorphous silicon, single-crystal silicon, or the like.

In the main etching of step S2, the laminated films 100 are etched to a pattern of the mask 101, thereby forming a recess, as illustrated in FIG. 3B. Further, the etching is performed until the underlayer 102 is exposed, as illustrated in FIG. 3C.

Accordingly, in main etching, the laminated films 100 are etched by the plasma of the gas supplied to the plasma processing apparatus 1, via the opening HL of the mask 101, thereby forming the recess having the etched shape in the laminated films 100. The recess formed in the laminated films 100 and having the shape of a hole, may also be referred to as an opening HL.

FIG. 4A and FIG. 4B are diagrams illustrating an example of the opening HL according to one embodiment. As illustrated in FIG. 4A, the opening HL includes a plurality of first openings HL1, and a plurality of second openings HL2. The second openings HL2 are positioned to surround outer sides of the first openings HL1, and no opening is formed on outer sides of the second openings HL2. The Critical Dimension (CD) values of the first openings HL1 and the second openings HL2 are the same. A distance between the second opening HL2 in an outermost peripheral region 2, and the first opening HL1 in a region 1 adjacent to the second opening HL2, is greater than or equal to a distance between two adjacent first openings HL1 in the region 1.

In the configuration described above, the opening HL according to this embodiment is defined as having dense and coarse patterns in the mask 101. That is, when the region 1 having the plurality of first openings HL1 formed therein and the region 2 (region on the outer side of the region 1) having the plurality of second openings HL2 formed therein are compared, the pattern of the mask 101 in the region 1 is more dense than the pattern of the mask 101 in the region 2. In other words, the pattern of the mask 101 in the region 2 is more coarse than the pattern of the mask 101 in the region 1.

The recess formed in the laminated films 100 may have a line shape. In FIG. 4B, the line-shaped recess is represented by a first opening LN1, and a second opening LN2. The second opening LN2 is positioned to surround outer sides (or outer periphery) of the first opening LN1, and no opening is formed on outer sides (or outer periphery) of the second opening LN2.

As illustrated in FIG. 4B, between the region 1 in which the first opening LN1 is formed, and the region 2 in which the second opening LN2 is formed, there is a difference in the densities of the patterns of the mask 101. The pattern of the mask 101 is dense in the region 1, and the pattern of the mask 101 is coarse in the region 2. Hereinafter, the opening HL will be described as an example of the pattern of the mask 101, however, the etching method according to this embodiment may similarly be applied to the pattern of the mask 101 having the line-shaped recess.

As illustrated in FIG. 3A through FIG. 3C, the recess is formed by etching the laminated films 100, and a thickness of the mask 101 decreases as a depth of the recess increases. Further, when the laminated films 100 are used, an aspect ratio of the recess becomes high, and the etch rate of laminated films 100 decreases due to effects of depth loading. Particularly when forming a shape having a high aspect ratio of 40 or higher by the etching, the mask 101 may be eliminated before the underlayer 102 becomes exposed, and there is a possibility that the etching will not be completed. For this reason, there are demands to etch the laminated films 100 having a high mask selectivity.

FIG. 5A through FIG. 5C illustrate the mask selectivity and the depth difference between the center portion and the peripheral portion of the pattern. In FIG. 5A, the abscissa indicates the mask selectivity, and the ordinate indicates the depth difference ($\Delta ON$ depth=inner-outer) between the first opening HL1 (inner) and the second opening HL2 (outer).

In general, as illustrated in FIG. 5A, etching results with a high mask selectivity are obtained by using a gas having a high C/F ratio, such as a $C_4F_8$ gas, a $C_4F_6$ gas, or the like, that is, the gas having a high ratio of carbon (C) with respect to fluorine (F), when compared to using a $CF_4$ gas, a $C_3F_8$ gas, or the like. In addition, when the mask selectivity is approximately 4 or lower, the depth difference ($\Delta ON$ depth) becomes close to 0 for each of these gases. In this case, the depth of the first opening HL1, and the depth of the second opening HL2, are approximately the same, as illustrated FIG. 5B.

However, when the mask selectivity is 4 or higher, the depth difference sharply increases for each of these gases. In this case, the depth of the first opening HL1 becomes greater (that is, deeper) than the depth of the second opening HL2, as illustrated in FIG. 5C. In other words, a difference is introduced between the depth of the first opening HL1 and the depth of the second opening HL2 in the laminated films 100, which are etched with respect to the dense and coarse patterns in the mask 101.

Figure 6:
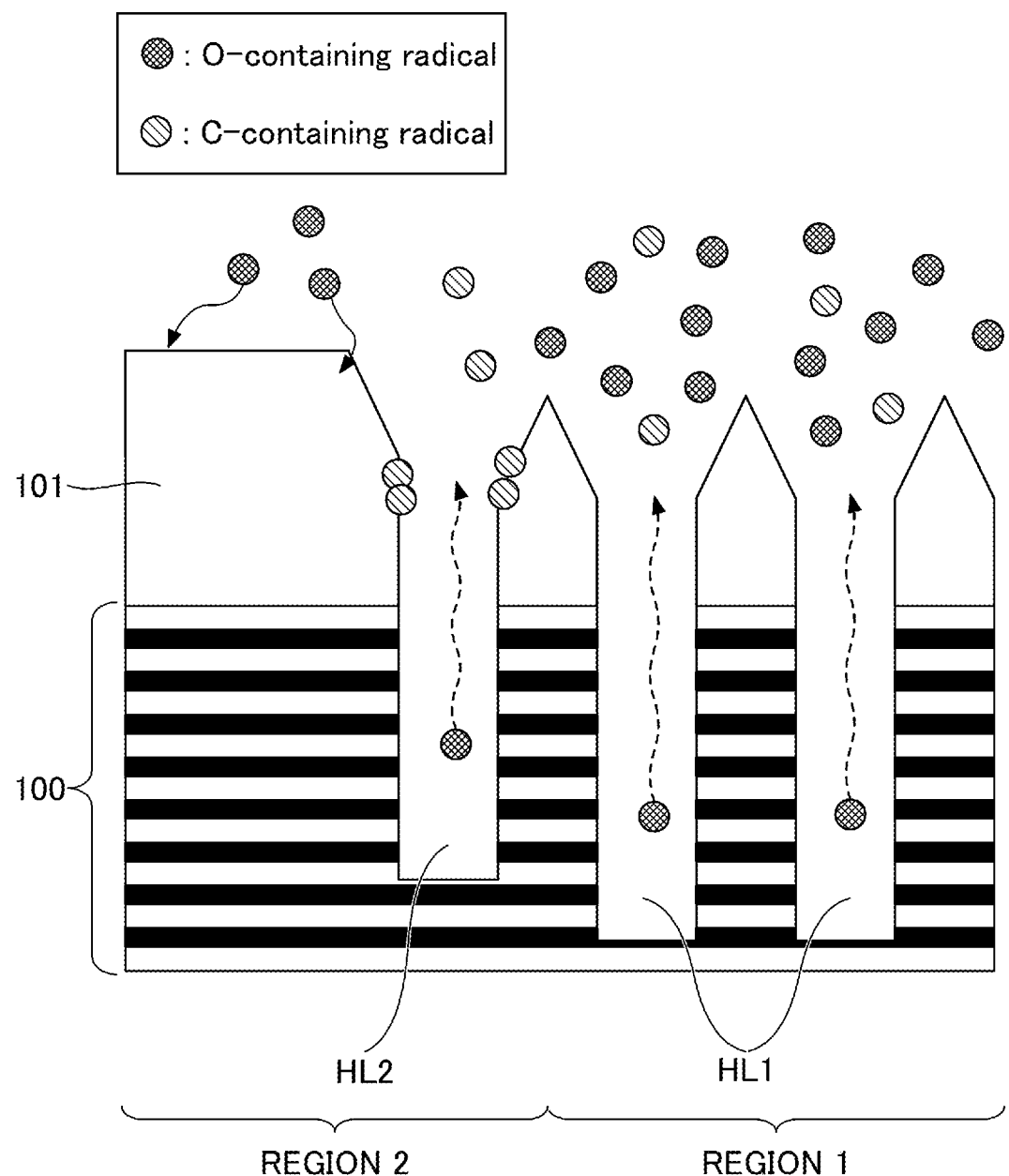
FIG. 6 is a diagram for explaining a mechanism of etching the opening.

FIG. 6 is a diagram for explaining an etching mechanism of the first opening HL1 and the second opening HL2. FIG. 6 illustrates the first opening HL1 at the left end illustrated in FIG. 4A, and the second opening HL2 adjacent to the right of this first opening HL1. The pattern of the mask 101 is dense in the region 1 where the first opening HL1 is formed, and the pattern of the mask 101 is coarse in the region 2 where the second opening HL2 is formed.

As illustrated in FIG. 6, the depth of the second opening HL2 becomes smaller (that is, shallower) than the depth of the first opening HL1 when the laminated films 100 are etched with respect to coarse and dense patterns of the mask 101.

In the initial state where the etching is started, the depths of the first opening HL1 and the second opening HL2 formed in the laminated films 100 are approximately the same. However, as the etching of the laminated films 100 progresses, an O-containing radical, which is the reaction product generated during the etching, vaporize and exit outside the mask 101 via the first opening HL1 and the second opening HL2. Because the gas used for the main etching does not include O radicals, no O-containing radicals are present in the generated plasma. For this reason, it may be seen that the generated O-containing radicals are the radicals that are generated from the reaction product when the $SiO_2$ in the laminated films 100 is etched.

On the other hand, because the etching gas includes C radicals and F radicals, the C radicals and the F radicals are present in the generated plasma. The F radicals, of the C radicals and the F radicals, are mainly consumed by the etching of the laminated films 100, and the C radicals are deposited on the mask 101.

In this case, the plurality of the first openings HL1 are densely formed in the region 1, while the plurality of the second openings HL2 are coarsely formed in the region 2. Hence, the O-containing radicals exiting outside the mask 101 from the plurality of the second openings HL2 in the region 2, is less than the O-containing radicals exiting outside the mask 101 from the plurality of the first openings HL1 in the region 1.

As a result, in the region 1, the O-containing radicals reacts with the C-containing radicals to form $CO_x$ and becomes volatile. Because the C radicals are consumed in the region 1 in this manner, it is possible to reduce the C radicals from depositing to the open ends of the mask 101 and narrowing the open ends of the mask 101. For this reason, in the region 1, the CD value of the open end of the mask 101 does become narrow, and sufficient F-containing radicals enter inside the first opening HL1 from the open end of the mask 101, and reach the bottom, thereby promoting the etching.

On the other hand, because the plurality of the second openings HL2 are coarsely formed in the region 2, the ratio of the generated O-containing radicals is lower than that in the region 1. For this reason, in the region 2, the C-containing radicals that are consumed by reacting with the O-containing radicals is less than that in the region 1, and there are more C radicals deposited to the open ends of mask 101 than in the region 1. Accordingly, in the region 2, the CD value of the open end of the mask 101 becomes narrow due to the deposition of the C radicals, and it is difficult for sufficient F-containing radicals to enter inside the second opening HL2 from the narrowed open end of the mask 101, and the etch rate decreases due to the decrease in the F-containing radicals reaching the bottom.

As a result, the etching is promoted in the plurality of the first opening HL1 in the region 1, while the etching is not promoted in the plurality of the second opening HL2 in the region 2, so that the depth of the recess of the second opening HL2 becomes smaller (that is, shallower) than the depth of the recess of the first opening HL1.

However, a high throughput by a high etch rate, and a high mask selectivity are required regardless of the dense and coarse patterns of the mask 101. In order to obtain the high throughput, it is desirable that the etching unlikely generates the difference between the depth of the recess of the second opening HL2 and the depth of the recess of the first opening HL1.

Accordingly, the etching method proposed in this embodiment achieves the high throughput and the high mask selectivity when etching the laminated films 100, regardless of the dense and coarse patterns of the mask 101, and enables etching of a shape having a high aspect ratio of 40 or higher, for example.

The etching method according to this embodiment achieves the high throughput and the high mask selectivity by the etching. In addition, a gas, which unlikely reduces the CD value of the open end of the second opening HL2 when the C radicals stick to the mask 101, is selected.

More particularly, the laminated films 100 are etched by the plasma of the process gas including the carbon and fluorine-containing gas. In this embodiment, the carbon and fluorine-containing gas includes the unsaturated bond of C, and the $CF_3$ group. Examples of the carbon and fluorine-containing gas include fluorocarbon gases, hydrofluorocarbon gases, or the like. The hydrofluorocarbon gas may be a $C_3H_2F_4$ gas, for example. Further, in this embodiment, the processing gas may further include a hydrogen-containing gas, and an example of the hydrogen-containing gas may be a $H_2$ gas, for example.

Hence, the CD value of the open end of the mask 101 is maintained uniform regardless of the coarse and dense patterns of the mask 101, and it is possible to provide the etching process which hardly generates the difference between the depth of the first opening HL1 in the region 1 and the depth of the second opening HL2 in the region 2. The etching method according to this embodiment will be described in more detail in the following.

Figure 7:
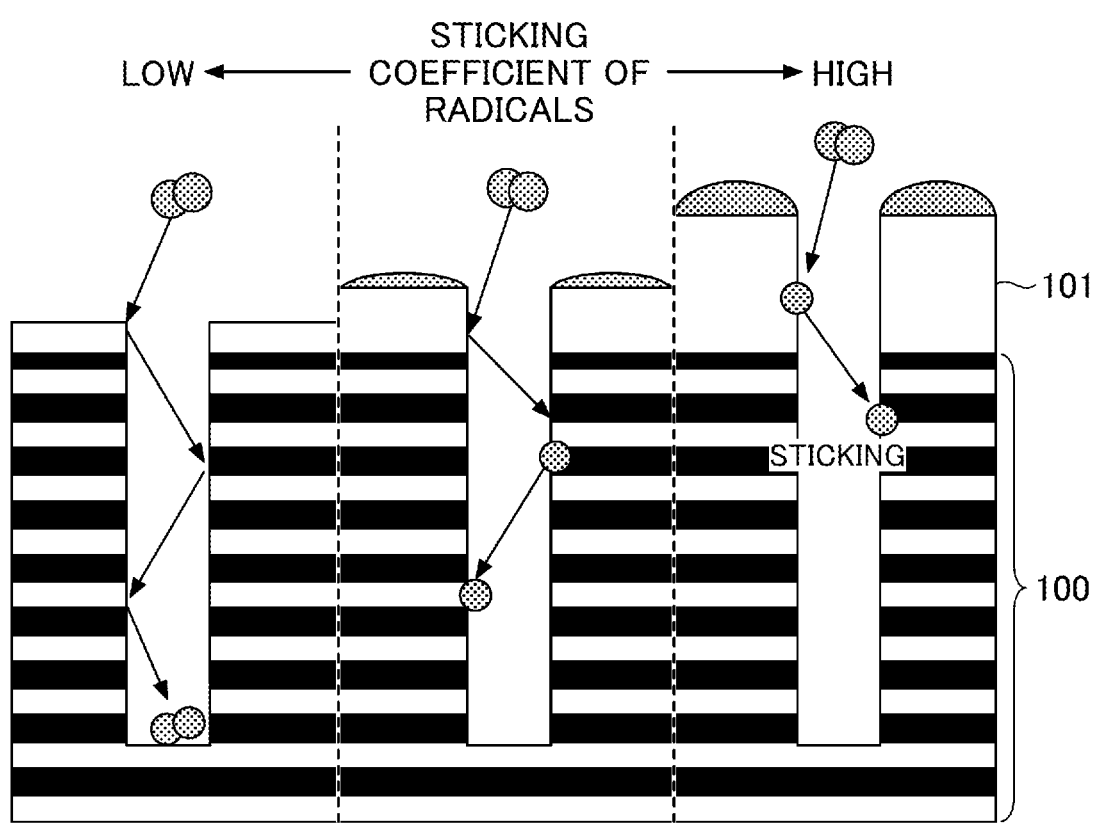
FIG. 7 is a diagram illustrating an example of a depth to which radicals reach with respect to the opening of the etched film according to a sticking coefficient.

In order to select a gas which unlikely reduces the CD value of the open end of the second opening HL2 when the C radicals stick to the mask 101, the sticking coefficient (probability of reaction) of the gas is preferably low. FIG. 7 is a diagram illustrating an example of the depth to which the radicals reach with respect to the opening of the etched films according to the sticking coefficient.

As illustrated in FIG. 7, when the sticking coefficient of the radicals is low, the number of radicals sticking to the side surface at an intermediate portion of the opening is small, and the radicals reach the bottom of the opening or the deep portion of the opening. On the other hand, the higher the sticking coefficient is, the larger the number of radicals sticking to the side surface at the intermediate portion of the opening is, and the more difficult it is to supply the radicals to the bottom of the opening or the deep portion of the opening.

In other words, the lower the low molecular structure of the gas is, the lower the sticking coefficient becomes, and the harder it is for the reaction product to stick with respect to the mask 101, thereby enabling the etching to proceed without narrowing the opening in the mask 101. In this case, however, the mask selectivity becomes low.

Figure 8:
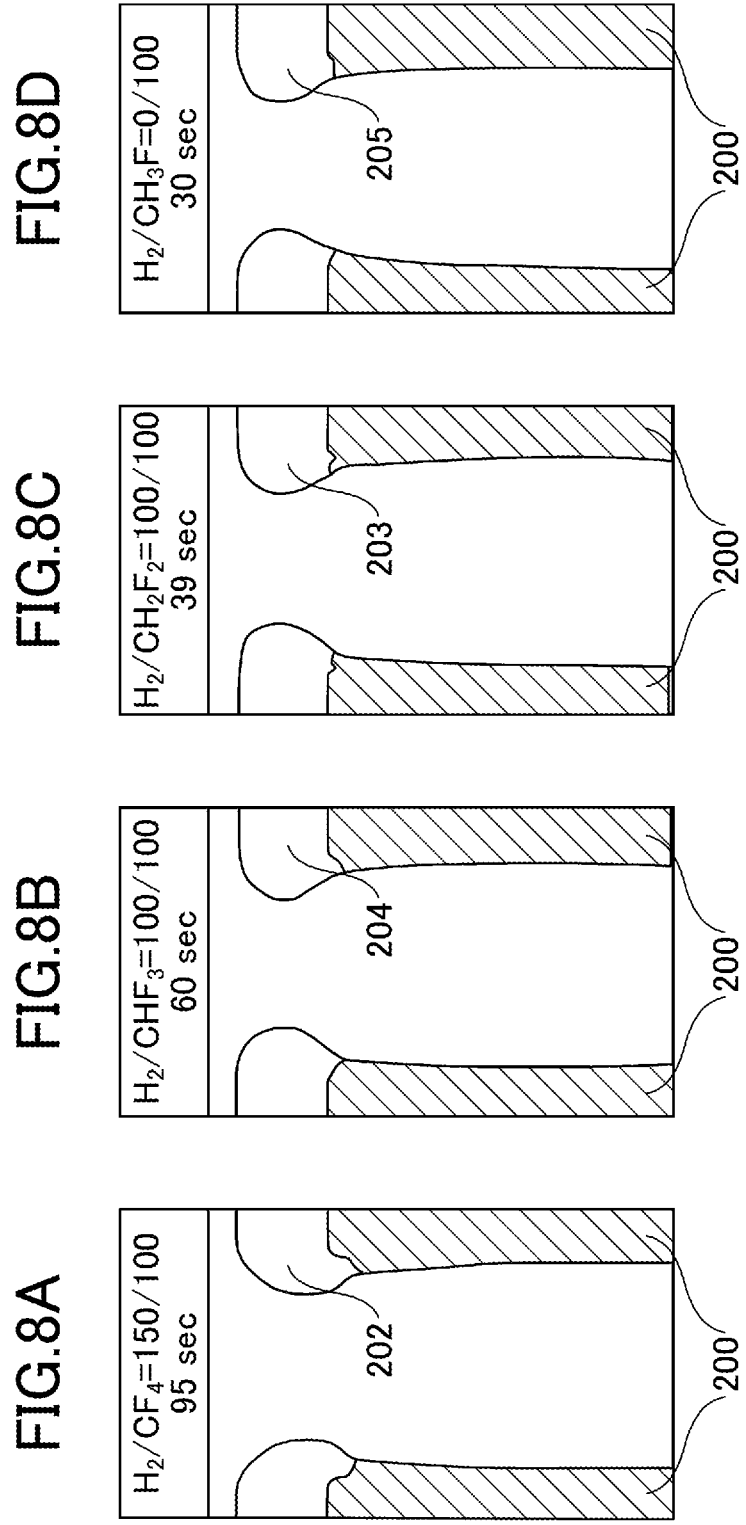
FIG. 8A, FIG. 8B, FIG. 8C, and FIG. 8D are diagrams illustrating an example of a relationship between a gas species and a deposit (reaction product) sticking position on a mask.

FIG. 8A through FIG. 8D are diagrams illustrating an example of a relationship between a gas species and a deposit (reaction product) sticking position on the mask. FIG. 8A illustrates the state of the opening of a mask 202 when a $H_2/CF_4$ gas mixture is supplied. FIG. 8B illustrates the state of the opening of a mask 204 when a $H_2/CHF_3$ gas mixture is supplied. FIG. 8C illustrates the state of the opening of a mask 203 when a $H_2/CH_2F_2$ gas mixture is supplied. FIG. 8D illustrates the state of the opening of a mask 205 when a $H_2/CH_3F$ has mixture is supplied. The masks 202 through 205 may be made of the same organic material as the mask 101.

Because the sticking coefficient for the hydrofluorocarbon gas (FIG. 8B through FIG. 8D) is higher when compared to the fluorocarbon gas (FIG. 8A), and the mask selectivity is high, the C radicals easily stick to an upper portion of the mask and the opening of the mask is uneasily narrowed in FIG. 8B through FIG. 8D when compared to FIG. 8A. In other words, the gas having the low sticking coefficient has a high etch rate, but the mask selectivity is low. On the other hand, the gas having the high sticking coefficient has a high mask selectivity, but the etch rate is low.

In the etching method according to this embodiment, however, the etch rate and the mask selectivity, which are in a trade-off relationship, are simultaneously optimized, and the etching is performed so that a difference in etching depths is unlikely generated in the openings HL having coarse and dense patterns in the mask 101. For this reason, a hydrofluorocarbon gas, including the unsaturated bond of C and the $CF_3$ group, is used as the gas for the etching.

Figure 9:
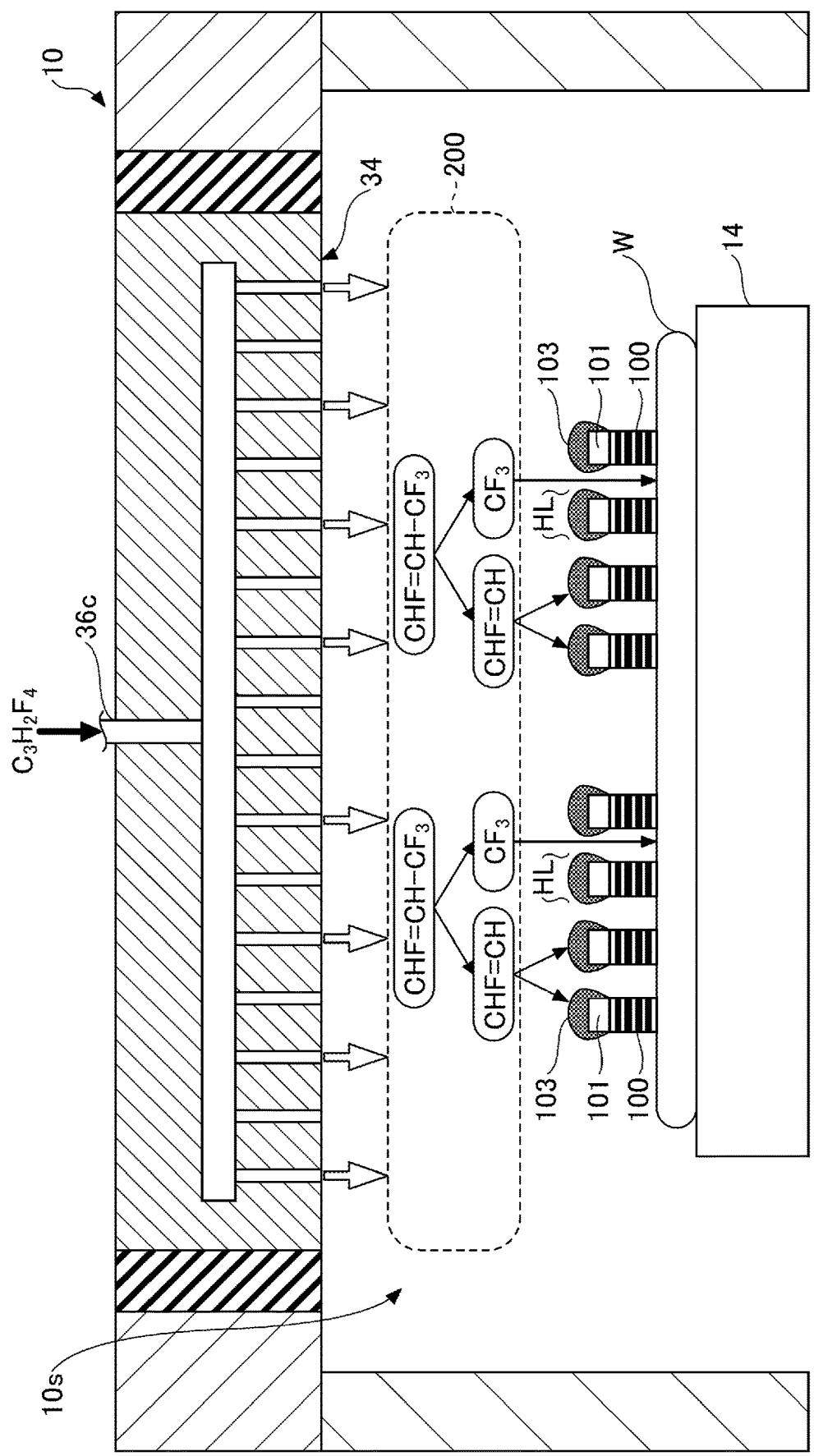
FIG. 9 is a diagram illustrating a precursor generation and a surface reaction model on the substrate according to one embodiment.

FIG. 9 is a diagram illustrating a precursor generation and a surface reaction model on the substrate W according to one embodiment. In FIG. 9, a $C_3H_2F_4$ gas is described as an example of the hydrofluorocarbon gas, including the unsaturated bond of C and the $CF_3$ group, that is used for the etching. Further, in this embodiment, double bond of C are described as an example of the unsaturated bond of C, however, the unsaturated bond of C are not limited to the double bond of C, and the gas may include triple bond of C, or the like.

As illustrated in FIG. 9, the $C_3H_2F_4$ gas included in the process gas supplied by the etching method according to this embodiment is supplied to the internal space 10s of the chamber 10, and dissociated in plasma 200.

Figure 10:
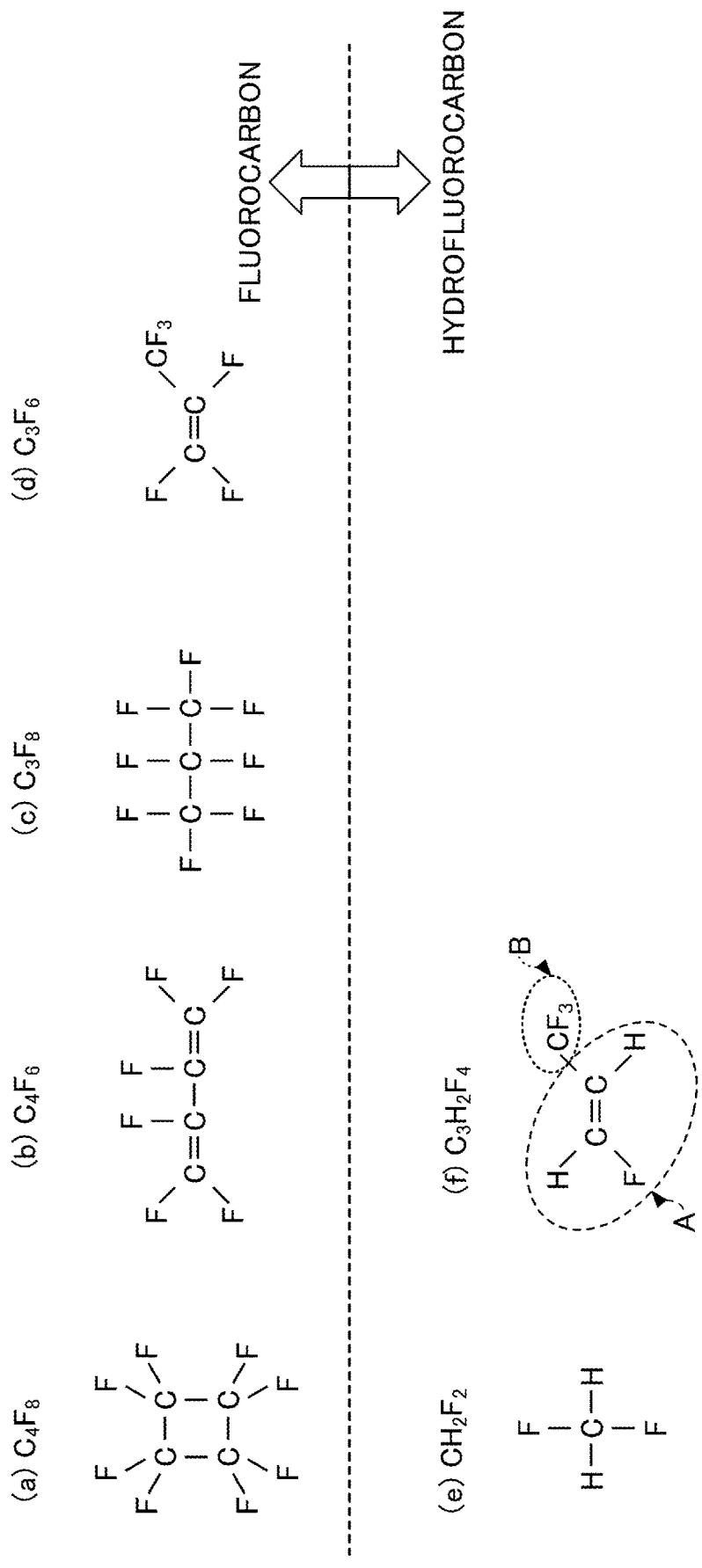
FIG. 10 is a diagram illustrating a structure of each gas species according to one embodiment.

FIG. 10 is a diagram illustrating the structure of each gas species according to one embodiment. The $C_3H_2F_4$ gas has the structure illustrated in an area (f) of FIG. 10, which is easily broken at the bond of the $CF_3$ group with the unsaturated bond of C, and is dissociated in the plasma 200 into a compound having the unsaturated bond of C (the double bond of C in this example), and a compound having the $CF_3$ group. In the following, the compound having the unsaturated bond of C will also be referred to as a carbon fragment A, and the compound having the $CF_3$ group will also be referred to as a fluorocarbon fragment B.

FIG. 9 illustrates a state where the $C_3H_2F_4$ gas (CHF=CH—$CF_3$) is dissociated in the plasma 200 into the carbon fragment A (CHF=CH), and the fluorocarbon fragment B ($CF_3$) in plasma 200.

When performing the etching, the carbon fragment A (CHF=CH) preferentially sticks on top of the mask 101 during the main etching, indicated by a reference numeral 103 in FIG. 9. This is because the carbon fragment A, including the double bond of C, is unstable and highly reactive, thereby increasing the sticking coefficient and preferentially sticking easily on top of the mask 101. On the other hand, the fluorocarbon fragment B is transported via the mask 101 during the main etching, and reaches the bottom of the opening HL (recess) formed in the laminated films 100, and further etches the laminated films 100 because the fluorocarbon fragment B includes a large amount of F with respect to C. In other words, the carbon fragment A including the double bond of C contributes to the high mask selectivity, and the fluorocarbon fragment B including the $CF_3$ group contributes to the high etch rate. Accordingly, by supplying the process gas including the $C_3H_2F_4$ gas, the etching method according to this embodiment can simultaneously achieve a high throughput with the high etch rate, and a high mask selectivity.

In contrast, the $C_4F_8$ gas illustrated in an area (a) of FIG. 10 cannot obtain a high mask selectivity. Thus, when performing the etching using the $C_4F_8$ gas, it is difficult to simultaneously achieve the high throughput and the high mask selectivity.

The $C_4F_6$ gas illustrated in an area (b) of FIG. 10 includes two double bonds of C but no $CF_3$ group. For this reason, a high mask selectivity can be obtained, but a high etch rate cannot be obtained. As a result, it is difficult to simultaneously achieve the high throughput and the high mask selectivity by the etching using the $C_4F_6$ gas.

The $C_3F_8$ gas illustrated in an area (c) of FIG. 10 includes the $CF_3$ group which provides the high etch rate, but does not include unsaturated bond of C, making it difficult to obtain a high mask selectivity. Hence, it is difficult to simultaneously achieve the high throughput and the high mask selectivity by the etching using the $C_3F_8$ gas. The $CH_2F_2$ gas illustrated in an area (e) of FIG. 10 similarly does not include the unsaturated bond of C, and thus, it is difficult to obtain a high mask selectivity. For this reason, it is difficult to simultaneously achieve the high throughput and the high mask selectivity by the etching using the $CH_2F_2$ gas.

The $C_3F_6$ gas illustrated in an area (d) of FIG. 10 includes the $CF_3$ group, resulting in a high etch rate. The double bond of C also provides a high mask selectivity. Accordingly, the high throughput and the high mask selectivity can be simultaneously achieved by the etching using the $C_3F_6$ gas. However, in the laminated films 100 including the silicon oxide films and the silicon nitride films that are alternately laminated, hydrogen is required to etch the silicon nitride film. Thus, in the etching using the $C_3F_6$ gas, it is necessary to include the $C_3F_6$ gas and the hydrogen-containing gas in the process gas.

When the $C_3F_6$ gas illustrated in the area (d) in FIG. 10 and the $C_3H_2F_4$ gas illustrated in the area (f) in FIG. 10 are compared, the hydrofluorocarbon gas of $C_3H_2F_4$ has a sticking coefficient higher than that of the fluorocarbon gas of $C_3F_6$. Hence, the $C_3H_2F_4$ gas can more easily stick the C radicals to the top of the mask 101 when compared to the $C_3F_6$ gas, thereby enabling the mask selectivity to be increased when compared to the $C_3F_6$ gas.

However, the carbon and fluorine-containing gas used in the etching process according to this embodiment is not limited to the $C_3H_2F_4$ gas and the $C_3F_6$ gas. For example, the carbon and fluorine-containing gas may be any gas which, upon dissociation in the plasma 200, dissociates into a compound having a fragment which includes an unsaturated bond of C, and a fragment which includes a $CF_3$ group.

Experimental Results Exp1: Depth Differences of First Opening and Second Opening Depending on Gas Species Next, experiments were conducted to measure the difference (depth difference) between the depth of the first opening HL1 and the depth of the second opening HL2 for each gas species, by comparing the etching method according to this embodiment using the $C_3H_2F_4$ gas with etching using a plurality of other gas species.

The etching conditions in this embodiment are as follows.
<Etching Conditions of Experimental Results Exp1>
Pressure inside process chamber: 20 mT (2.67 Pa)
High-frequency power HF: On
High-frequency power LF: On
Process gas: $C_3H_2F_4$, $C_4F_8$, $C_4F_6$, and $CH_2F_2$
Added gas: Hydrogen ($H_2$) gas
Surface temperature of substrate: 0° C.

Figure 11:
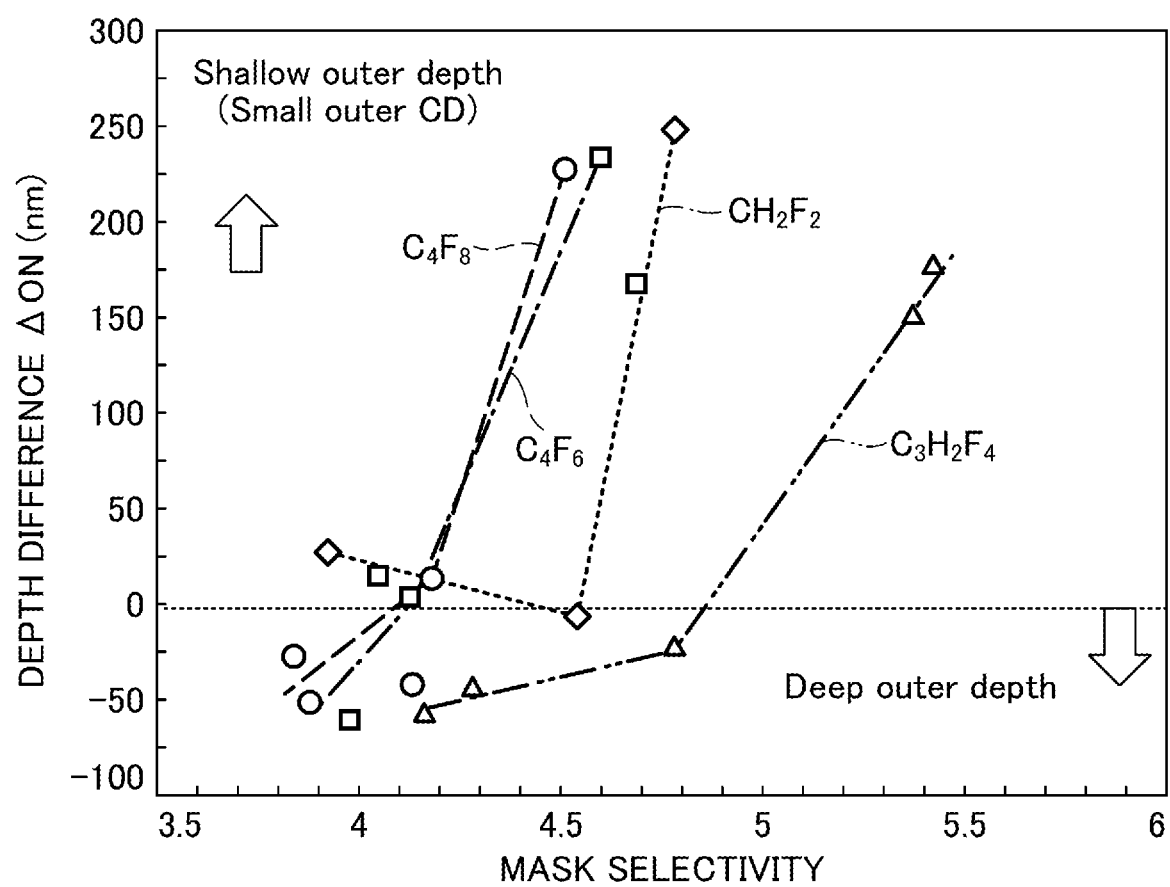
FIG. 11 is a diagram illustrating a mask selectivity, and a depth difference between a center portion and a peripheral portion of a pattern according to one embodiment.

FIG. 11 is a diagram illustrating the mask selectivity, and the depth difference between the center portion and the peripheral portion of the pattern according to one embodiment. The experimental results Exp1 were obtained using the 4 gases illustrated in FIG. 11. In FIG. 11, the abscissa indicates the mask selectivity, and the ordinate indicates the depth difference (ΔON depth=inner-outer) between the first opening HL1 (inner) and the second opening HL2 (outer). The cases where the $C_4F_8$ gas and the $C_4F_6$ gas are used, are the same as those illustrated in FIG. 5A.

According to the experimental results Exp1 of FIG. 11, in the case where the $C_4F_8$ gas and the $C_4F_6$ gas are used, the depth difference (ΔON depth) of each of the gases is close to zero when the mask selectivity is approximately 4 or lower. In this case, as illustrated in FIG. 5B, the depth of the first opening HL1 and the depth of the second opening HL2 are approximately the same.

However, when the mask selectivity is 4 or higher, the depth difference increases for each of the gases. In this case, as illustrated in FIG. 5C, the depth of the first opening HL1 is greater (that is, deeper) than the depth of the second opening HL2.

When the $CH_2F_2$ gas is used, the depth difference is close to zero when the mask selectivity is approximately 4.5 or lower. However, when the mask selectivity is 4.5 or higher, the depth difference increases, and the etching becomes as illustrated in FIG. 5C.

In contrast, in the case where the $C_3H_2F_4$ gas is used, the depth difference is close to zero, and the etching progressed as illustrated in FIG. 5B when the mask selectivity is approximately 4.8 to 4.9 or lower.

These results showed that when the $C_3H_2F_4$ gas is used, the carbon fragment A including the unsaturated bond of C contributed to the high mask selectivity, and the mask selectivity was higher compared to when the $CH_2F_2$ gas without the unsaturated bond of C is used. In addition, it was found that the carbon fragment A having the unsaturated bond of C preferentially sticks to the top of the mask 101, and does not narrow the opening of the mask 101, and that there is no difference between the progress of etching of the first opening HL1 and the etching of the second opening HL2, thereby enabling the recesses with the same depth to be formed.

Experimental Results Exp2: Mask Selectivity and Etch Rate of Laminated Films

Figure 12:
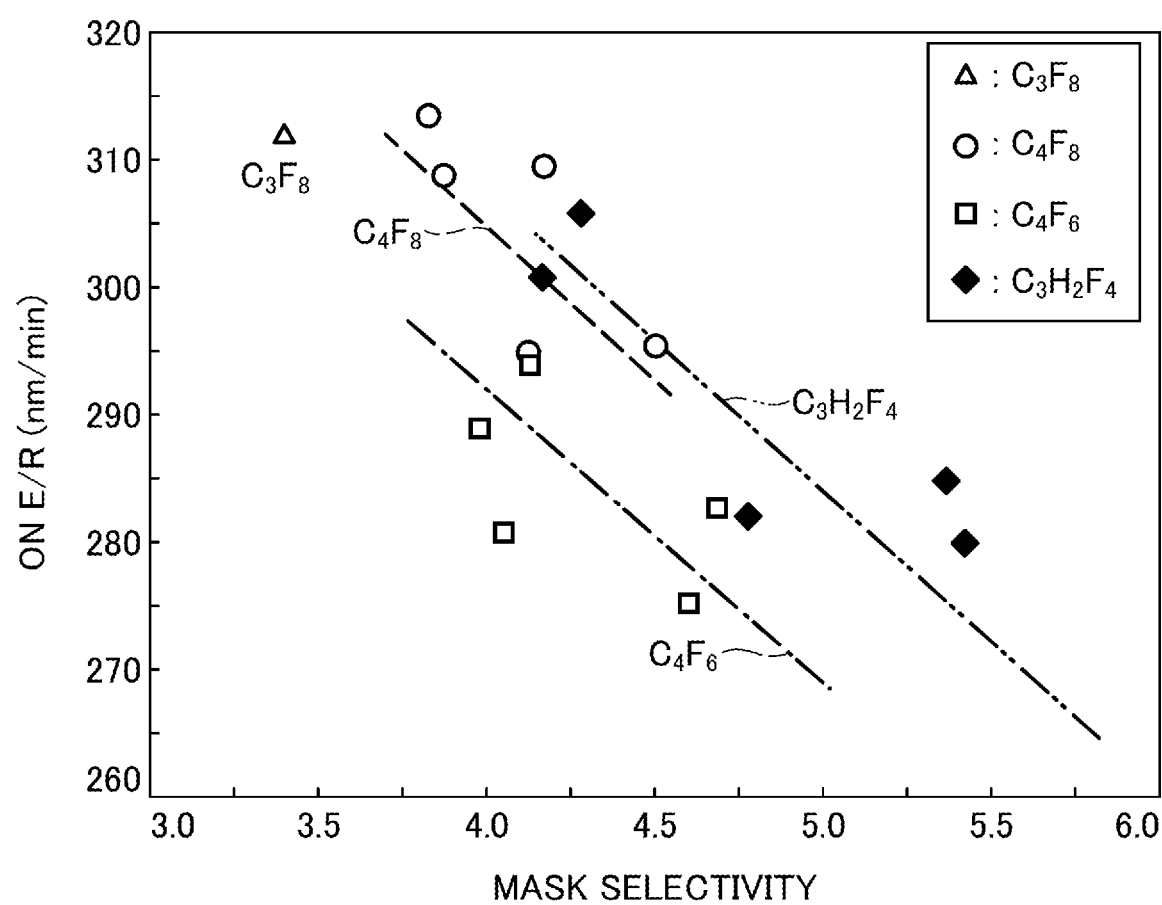
FIG. 12 is a diagram illustrating the mask selectivity, and an etch rate of the laminated films according to one embodiment.

Next, experiments were conducted to determine the relationship between the mask selectivity and the etch rate of the laminated films 100 when the $C_3H_2F_4$ gas and the plurality of other gas species are used. FIG. 12 is a diagram illustrating the mask selectivity, and the etch rate of the laminated films 100 according to one embodiment. The process conditions of the experimental results Exp2, other than the gases, are illustrated in the <Etching Conditions of Experimental Results Exp1> described above.

According to the experimental results Exp2 of FIG. 12, it was found that there is also a trade-off relationship between the mask selectivity and the etch rate of the laminated films 100 when the $C_4F_8$, $C_4F_6$, $C_3F_8$, and $C_3H_2F_4$ gases are used.

The use of the $C_4F_6$ gas reduced the etch rate and the throughput of the laminated films 100 compared to other gases. In addition, when the $C_4F_6$ gas is used, the mask selectivity is relatively low compared to when other gases are used. When the $C_3F_8$ gas is used, the etch rate of the laminated films 100 is high, but the mask selectivity of 3.4 or higher cannot be reached, such that the high mask selectivity and the high etch rate cannot be simultaneously achieved.

The use of the $C_3H_2F_4$ gas improves the trade-off between the mask selectivity and the etch rate when compared to using of the $C_4F_8$ gas, enabling the high mask selectivity and reducing the decrease in the etch rate. This is because the carbon fragment A having the unsaturated bond of C contributes to the high mask selectivity when the $C_3H_2F_4$ gas is used, while the fluorocarbon fragment B having the $CF_3$ group contributes to the high etch rate.

Figure 13A:
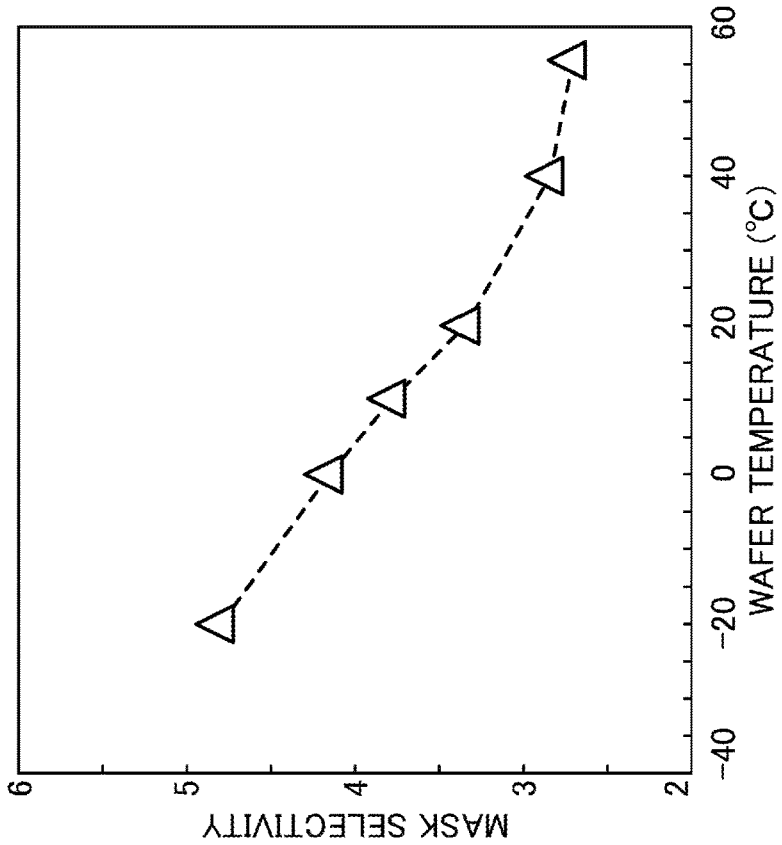
FIG. 13A and FIG. 13B are diagrams illustrating the etch rate and the mask selectivity of the laminated films with respect to a surface temperature of the substrate according to one embodiment.
Figure 13B:
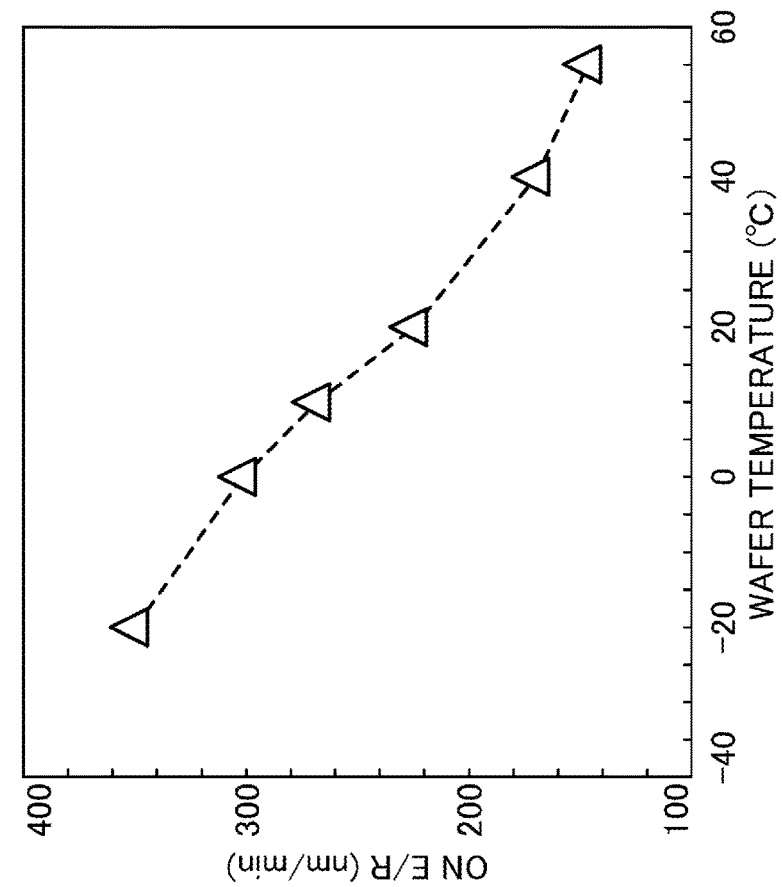

Experimental Results Exp3: Etch Rate of Laminated Films and Mask Selectivity with Respect to Surface Temperature of Substrate Next, experiments were conducted to determine the relationship between the etch rate of the laminated films and the mask selectivity with respect to the surface temperature of the substrate when using the $C_3H_2F_4$ gas. FIG. 13A and FIG. 13B are diagrams illustrating the relationship between the etch rate of the laminated films and the mask selectivity with respect to the surface temperature of the substrate according to one embodiment. The process conditions of the experimental results Exp3, other than the gases and the surface temperature of the substrate, are illustrated in the <Etching Conditions of Experimental Results Exp1> described above.

As illustrated in FIG. 13A, the etch rate of the laminated films 100 is increased by lowering the surface temperature of the substrate. In addition, as illustrated in FIG. 13B, by lowering the surface temperature of the substrate, the mask selectivity is increased. In the comparison of the gas species in the experimental results Exp1 illustrated in FIG. 11) and experimental results Exp2 illustrated in FIG. 12, the surface temperature of the substrate is 0° C. Therefore, in order to obtain the condition in which the mask selectivity can be made higher, it is desirable to control the surface temperature of the substrate to 0° C. or less.

Summary of Experimental Results

FIG. 14 summarizes the results of the experiments. FIG. 14 is a table illustrating the mask selectivity and the etch rate of the laminated films for each of the gas species according to one embodiment. The "mask selectivity" among the items in the table of FIG. 14 indicates the mask selectivity that is obtained while maintaining the open end of the second opening HL2 open. The "ON E/R" indicates the etch rate that is obtained with the depth difference between the first opening HL1 and the second opening HL2 maintained at approximately 0, and represents the etch rate of the laminated films 100 when the mask selectivity is fixed to 4.

Among the 5 gas species, the etching using a gas mixture $H_2/C_4F_8$ resulted in a good etch rate of the laminated films 100, but a low mask selectivity due to the absence of the unsaturated bond of C, and the high mask selectivity and the high etch rate of the laminated films 100 cannot be simultaneously achieved.

The etching using a gas mixture $H_2/CH_2F_2$ resulted in a good etch rate of the laminated films 100, but the improvement of the mask selectivity was small due to the absence of the unsaturated bond of C, and the high mask selectivity and the high etch rate of the laminated films 100 cannot be simultaneously achieved.

The etching using a gas mixture $H_2/C_3H_2F_4$ includes the unsaturated bond of C and the $CF_3$ group in the gas mixture, and thus, both the etch rate and the mask selectivity of the laminated films 100 are good, and the high mask selectivity and the high etch rate of the laminated films 100 can be achieved simultaneously.

In the etching using a gas mixture $H_2/C_4F_6$, because the etch rate of the laminated films 100 is low due to the absence of the $CF_3$ group, the improvement of the mask selectivity is not achieved, and the high mask selectivity and the high etch rate of the laminated films 100 cannot be simultaneously achieved.

The etching using a gas mixture $H_2/C_3F_8$ failed to achieve a mask selectivity of 3.4 or higher, and the high mask selectivity and the high etch rate of the laminated films 100 cannot be simultaneously achieved.

As described above, in the etching method according to this embodiment, the process gas including the $H_2$ gas and the $C_3H_2F_4$ gas can be used to simultaneously achieve the high mask selectivity and the high etch rate of the laminated films 100.

In addition, the high throughput and the high mask selectivity can be achieved, regardless of the coarse and dense patterns of the mask 101, such as when etching the laminated films 100 having the openings HL that are densely disposed at the inner portion and coarsely disposed at the outermost periphery in a plan view, for example.

For example, the radicals generated from the hydrofluorocarbon gas have a higher sticking coefficient than those generated from the fluorocarbon gas, and higher polymers have a higher sticking coefficient. The double bond of C is easily deposited on the mask 101, resulting in the high mask selectivity. The $CF_3$ group also contributes to securing the etch rate of the laminated films 100. Therefore, it is possible to prevent the difference in the depths (shapes) of each opening (the first opening HL1 and the second opening HL2) formed in the laminated films 100 from being generated when the laminated films 100 are used as the film to be etched.

The etching method according to the embodiments disclosed herein should be considered exemplary in all respects and non-limiting. Embodiments may include variations, modifications, and substitutions in various forms, without departing from the scope and spirit of the present disclosure.

The plasma processing apparatus according to the present disclosure is applicable to any of the following types of apparatuses, including Atomic Layer Deposition (ALD) apparatuses, Capacitively Coupled Plasma (CCP) apparatuses, Inducibly Coupled Plasma (ICP) apparatuses, Radial Line Slot Antenna (RLSA) apparatuses, Electron Cyclotron Resonance Plasma (ECR) apparatuses, and Helicon Wave Plasma (HWP) apparatuses.

Therefore, according to the embodiments of the present disclosure, it is possible to reduce differences in the shapes of openings formed in an etched film, while improving a mask selectivity. electivity.

While certain embodiments have been described, these embodiments have been presented by way of example only, and are not intended to limit the scope of the disclosure. Indeed, the embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. An etching method comprising:
preparing a substrate having laminated films including a first film and a second film that are alternately laminated, and a mask on the laminated films; and
etching the laminated films by plasma of a process gas including a carbon and fluorine-containing gas that includes an unsaturated bond of C and a $CF_3$ group, via the mask, thereby forming a recess in the laminated films, wherein
the carbon and fluorine-containing gas dissociates, in the plasma, into a carbon fragment having the unsaturated bond of C and preferentially sticking on top of the mask during the etching, and a fluorocarbon fragment having the $CF_3$ group and transported via the mask to a bottom of the recess and further etching the laminated films,
the preparing uses the mask including, in a plan view, a plurality of first openings, and a plurality of second openings positioned to surround outer sides of the plurality of first openings, and
the mask, in the plan view, includes no openings formed on outer sides of the plurality of second openings.

2. The etching method as claimed in claim 1, wherein an aspect ratio of the recess is greater than or equal to 40.

3. The etching method as claimed in claim 2, wherein the carbon and fluorine-containing gas is a fluorocarbon gas or a hydrofluorocarbon gas.

4. The etching method as claimed in claim 1, wherein the carbon and fluorine-containing gas is a fluorocarbon gas or a hydrofluorocarbon gas.

5. The etching method as claimed in claim 4, wherein the hydrofluorocarbon gas is a $C_3H_2F_4$ gas.

6. The etching method as claimed in claim 1, wherein the process gas includes a hydrogen-containing gas, and the hydrogen-containing gas is $H_2$.

7. The etching method as claimed in claim 1, wherein the first film is a silicon oxide film, and the second film is a silicon nitride film.

8. The etching method as claimed in claim 1, wherein the mask has a plurality of first openings and a plurality of second openings, and
the plurality of second openings are positioned to surround outer sides of the plurality of first openings, and no opening is formed on outer sides of the plurality of second openings.

9. The etching method as claimed in claim 1, wherein the process gas further includes a hydrogen-containing gas.

10. The etching method as claimed in claim 1, wherein the etching controls a surface temperature of the substrate to a temperature lower than or equal to 0° C.

11. The etching method as claimed in claim 1, wherein the preparing prepares the substrate having an underlayer on which the laminated films are formed, and
the etching etches the laminated films by the fluorocarbon fragment having the $CF_3$ group until the underlayer becomes exposed when forming the recess.

12. The etching method as claimed in claim 1, wherein the plurality of first openings and the plurality of second openings have identical critical dimension values, and
in the plan view, a distance between one second opening of the plurality of second openings, located in an outermost peripheral first region of the mask, and one first opening of the plurality of first openings, located in a second region of the mask adjacent to the one second opening, is greater than or equal to a distance between two mutually adjacent first openings of the plurality of first openings in the second region of the mask.

* * * * *